April 27, 1965 J. G. COTTEN ETAL 3,181,010
TRANSISTOR CURRENT CONTROL CIRCUIT
Filed Dec. 28, 1962
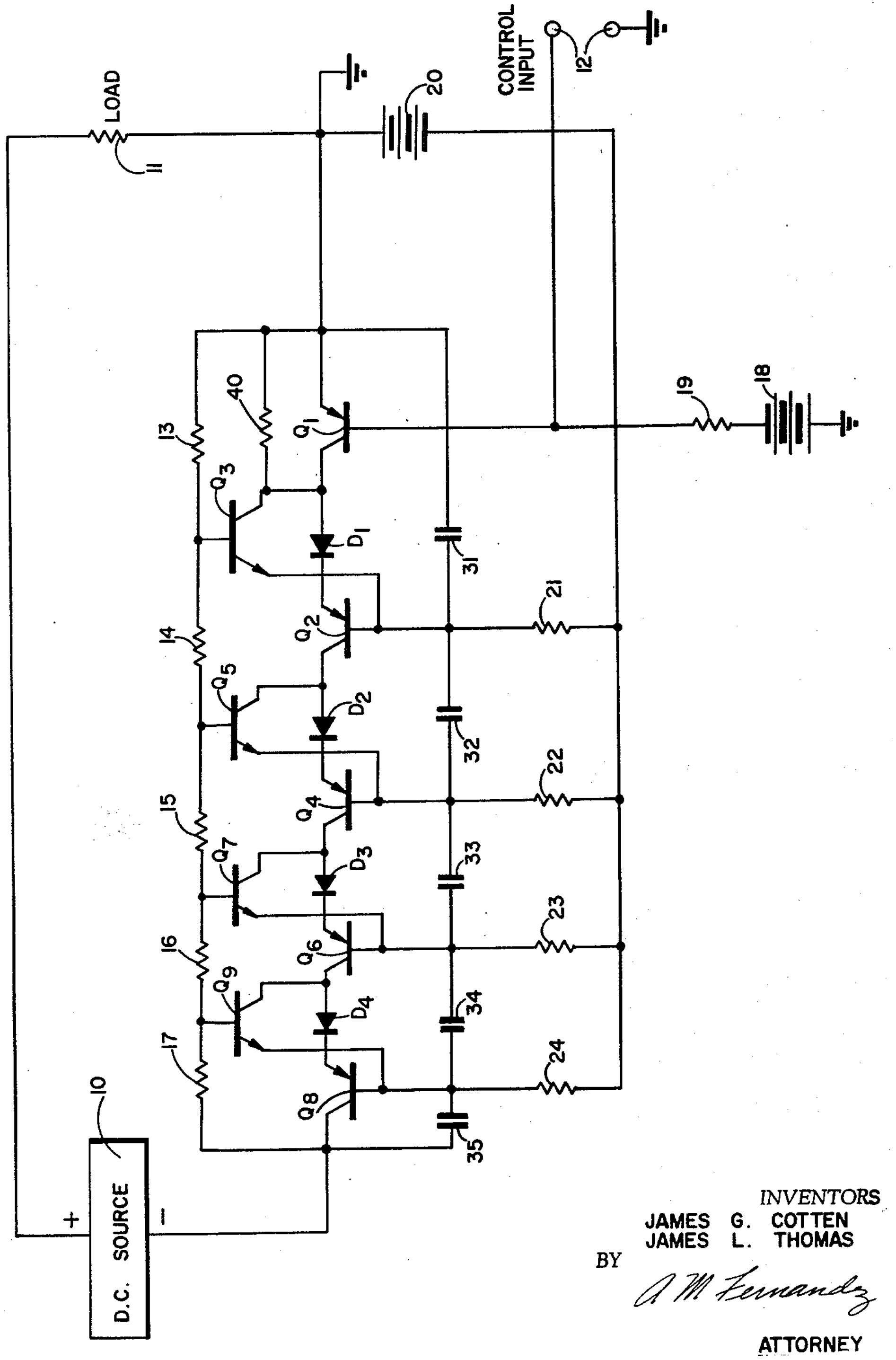
INVENTORS
JAMES G. COTTEN
JAMES L. THOMAS
BY A M Fernandez
ATTORNEY United States Patent Office 3,181,010
Patented Apr. 27, 1965

3,181,010
TRANSISTOR CURRENT CONTROL CIRCUIT

James G. Cotten, Anaheim, and James L. Thomas, La Habra, Calif., assignors to North American Aviation, Inc.

Filed Dec. 28, 1962, Ser. No. 247,964
12 Claims. (Cl. 307—88.5)

This invention pertains to an improved transistor circuit for controlling load current, and more particularly to a control circuit of the type connected in series between a source of voltage and a load.

Series connected circuits for regulating or controlling current through a load have been devised in the past with, for example, vacuum tube amplifiers, magnetic amplifiers and transistor amplifiers. Vacuum tube amplifiers are still widely used, particularly for high voltages but are vibration sensitive and are therefore unsuitable for many applications especially where space and weight must be conserved. Magnetic amplifiers are noisy and therefore also unsuitable for many applications, again especially where space and weight must be conserved. Transistor amplifiers are not vibration sensitive or noisy and are therefore ideally suited for use where space and weight must be conserved, but they are generally limited in their use because of their limited voltage range set by the breakdown voltage of their reverse biased collector junctions.

To overcome the limited voltage range of available power transistors, it is customary to place a plurality of transistors in series between the source and the load in order to divide among them the difference between the voltage of the current source and the voltage across the load. In such a circuit a voltage dividing network is employed to bias the transistors for substantially equal conduction. That is accomplished by connecting the voltage dividing network in parallel with the series-connected transistors and connecting the base electrodes of each transistor, except the base electrode of the one used as the series controlling element, to equal divisions of the dividing network. However, this biasing technique does not assure that the series-connected transistors will share the voltage drop across them equally with the one used for control since the one used for control is independently biased.

An object of this invention is to provide an improved control circuit in which current to a load is controlled by a circuit including a plurality of transistors connected in series with the source and the load.

In accordance with the present invention, a plurality of transistors are connected in emitter-to-collector series for the conduction of controlled current to the load and in parallel with a voltage dividing network employed in a novel manner to assure that each series-connected transistor shares equally the difference in voltage between the source of current and the load. The first transistor in series has its base electrode connected to a control input terminal adapted to receive control signals for modifying base current thereby controlling current through the load. The base electrodes of the successive series-connected transistors are connected to successive points along the voltage dividing network by the base-to-emitter junctions of a plurality of complementary type transistors, the collector electrodes of which are each connected to the collector electrode of their respectively proceeding series-connected transistor, thereby effectively clamping the collectors of the series-connected transistors to the voltage dividing network through the base-to-collector junction of the complementary type transistors due to their high gain.

The invention and its advantages will be more fully understood from the following description with reference to the drawing in which the sole figure shows a circuit diagram of an illustrative embodiment.

The positive terminal of a D.C. source 10 is directly connected to a load 11. A return path from the load 11 to the negative terminal of the D.C. source 10 is provided by a plurality of series-connected transistors $Q_1$, $Q_2$, $Q_4$, $Q_6$ and $Q_8$. The base electrode of the first transistor $Q_1$ is connected to a control input terminal 12 which is adapted to receive control signals that control the base current therein to vary its emitter current and thereby the control current through the load 11.

The difference between the voltage across the load 11 and the voltage of the source 10 is impressed across the series-connected transistors $Q_1$, $Q_2$, $Q_4$, $Q_6$ and $Q_8$ and a voltage dividing network comprising resistors 13, 14, 15, 16 and 17 which divide that voltage difference proportional to their resistance. The voltage dividing network presents relatively high source impedance voltage references for transistors $Q_3$, $Q_5$, $Q_7$ and $Q_9$.

The transistor $Q_3$, which has its base electrode connected to the first voltage dividing point at the junction between the resistors 13 and 14, couples the collector of the control transistor $Q_1$ to the base electrode of the successive series-connected transistor $Q_2$. The transistors $Q_5$, $Q_7$ and $Q_9$ similarly couple the collector electrodes of the series-connected transistors $Q_2$, $Q_4$ and $Q_6$ to the base electrodes of the respectively successive transistors $Q_4$, $Q_6$ and $Q_8$.

Due to the high gain of transistor $Q_3$, the resistor 13 which provides a voltage reference for the base electrode of transistor $Q_2$ appears as a low impedance to the base of the transistor $Q_2$ and as a still lower impedance to the collector of the transistor $Q_1$, thus clamping the emitter-to-collector circuit of the transistor $Q_1$ to the voltage across the resistor 13. The emitter-to-collector circuits of the transistors $Q_2$, $Q_4$, $Q_6$ and $Q_8$ are similarly clamped to the voltages across the respective resistors 14, 15, 16 and 17.

The control transistor $Q_1$ is biased for class A operation by a D.C. voltage source 18 of about $-12$ volts through a resistor 19. The remaining transistors $Q_2$, $Q_4$, $Q_6$ and $Q_8$ are similarly biased for class A operation by a D.C. voltage source 20 of about $-6$ v. through respective resistors 21, 22, 23 and 24.

To decrease the current through the load 11, base current in the control transistor $Q_1$ is decreased by a control signal applied to the input terminals 12, thereby reducing the emitter current of the transistor $Q_1$ and causing a decrease in current through the load 11. Thus, by varying the base current of the control transistor $Q_1$, the voltage across the dividing network of resistors 13 to 17 is changed. That change in voltage is divided by the resistors 13, 14, 15, 16 and 17, causing each of the transistors $Q_2$, $Q_4$, $Q_6$ and $Q_8$ to continue to share with the transistor $Q_1$ the voltage difference between the source 10 and the load 11. That is accomplished automatically by a decrease in current through the load 11 which causes an increase in voltage across the resistors 13 to 17 in the dividing network thereby causing an increase in base currents through the transistors $Q_3$, $Q_5$, $Q_7$ and $Q_9$ which in turn cause a decrease in base currents through the transistors $Q_2$, $Q_4$, $Q_6$ and $Q_8$.

To assure equal division of the difference in voltage between the source 10 and the load 11 by the transistors $Q_1$, $Q_2$, $Q_4$, $Q_6$ and $Q_8$, the resistors 13 to 17 of the dividing network are made substantially equal, such as 5K ohms. For more equal division of the voltage difference between the series-connected transistors, each of the resistors 13, 14, 15, 16 and 17 should be made progressively larger due to the leakage of return current from the load to the source 10 through the base-to-emitter junctions of the transistors $Q_3$, $Q_5$, $Q_7$ and $Q_9$. Since the base-to-emitter current for each of the transistors $Q_3$, $Q_5$, $Q_7$ and $Q_9$ would be substantially the same, the exact values selected for the resistors 13 to 17 may be 4.5K, 4.75K, 5K, 5.25K and 5.5K ohms, respectively. However, for many applications not requiring too large a variation in load current, the resistors may be 4.5K, 5K, 5K, 5K and 5.5K ohms, respectively, for a good approximation of equal voltage sharing between the transistors $Q_1$, $Q_2$, $Q_4$, $Q_6$ and $Q_8$.

The biasing resistors 21 to 24 are selected to be progressively smaller to assure sufficient forward bias current through the emitter-to-base junctions of the respective transistors $Q_2$, $Q_4$, $Q_6$ and $Q_8$ to keep them biased for class A operation. That would require that at least $$\frac{I_c \text{ max.}}{\beta \text{ min.}}$$

be available as base current where $I_c$ max. is the maximum collector current and $\beta$ min. is the minimum current gain $$\frac{I_c}{I_b}$$

to be expected with the transistor selected. If type 2N1556A transistors are selected and two series-connected diodes of the type 1N647 are employed for emitter bias of each transistor in place of one of the diodes shown, such as diode $D_4$, the resistors 21, 22, 23 and 24 should be selected to be approximately 25.4K, 23.9K, 22.5K and 21K ohms. This requirement is due in part to the fact that each of the successive transistors $Q_2$, $Q_4$, $Q_6$ and $Q_8$ has progressively more emitter biasing diodes in its emitter-to-base current path from the source 20.

The coupling diodes $D_1$ to $D_4$ between stages also provide the emitter bias necessary to operate the transistors $Q_3$, $Q_5$, $Q_7$ and $Q_9$. For example, the transistor $Q_3$ has its collector connected to its emitter through the diode $D_1$ and the emitter-to-base junction of the transistor $Q_2$. The voltage drop through the emitter-to-base junction of the transistor $Q_2$ normally will not provide a potential on the collector of the transistor $Q_3$ which is sufficiently positive with respect to the emitter for operation. To provide sufficient voltage, the impedance of the diode $D_1$ is added in series with the impedance of the emitter-to-base junction in the transistor $Q_2$. If necessary, a second coupling diode may be connected in series with the diode $D_1$ depending on the types of transistors and diodes being employed. For example, if the transistor $Q_2$ is of the type 2N1556A, two diodes of the type 1N647 should be connected in series between the collector of the transistor $Q_1$ and the emitter of the transistor $Q_2$.

Capacitors 31 to 35 are connected to the base electrodes of the transistors $Q_2$, $Q_4$, $Q_6$ and $Q_8$ in order to stabilize the operation of the circuit at high frequencies. For that purpose, relatively large capacitors are selected such as capacitors having a capacitance of about .1 microfarad.

A resistor 40 is connected between the emitter of the transistor and its collector in order to provide sufficient current for the transistors $Q_1$, $Q_2$, $Q_4$, $Q_6$ and $Q_8$ if the control transistor $Q_1$ is permitted to be driven to cutoff by a large positive signal at the input terminals 12. The minimum current which the resistor 40 should provide is the sum of the collector cutoff current $I_{co}$ of the transistor $Q_1$, the base currents $I_b$ of the transistors $Q_2$, $Q_4$, $Q_6$ and $Q_8$ in addition to the collector current $I_c$ of the transistor $Q_3$. Using the components suggested hereinbefore in the illustrated embodiment, the resistor 40 should be selected to be 1.25K ohms.

The illustrative embodiment of the invention is intended for use with a D.C. source 10 which provides a voltage that may vary to as high as about 275 volts in order to regulate the load voltage at 155 volts. Accordingly, the series-connected transistors are expected to divide equally between them a voltage difference as high as 120 volts. If a higher difference between the voltages of the D.C. source and the load is to be divided, additional stages comprising complementary pairs of transistors, such as transistors $Q_8$ and $Q_9$, may be connected in series.

For automatic regulation of load voltage by controlling load current, a voltage sensing circuit may be connected across the load to produce a signal proportional to the load voltage. That signal may then be translated to the input terminals 12 as a control signal to cause a proportional change in the base current of the control transistor $Q_1$. For instance, a disturbance, such as a variation in the load 11 or the D.C. source 10, that would tend to increase the load voltage could be sensed to produce a proportional control signal that tends to decrease the on-biasing base current of the transistor $Q_1$, thereby reducing its emitter current proportionately and causing the load voltage to be proportionately decreased.

While the principles of the invention have now been made clear in an illustrative embodiment, obvious modifications particularly adapted for specific applications, environments and operating requirements may be made without departing from those principles. The appended claims are therefore intended to embrace any such modifications.

What is claimed is:

1. In an improved circuit for controlling current to a load
   - a first transistor of one conductivity type serially connected between a voltage source and said load, said first transistor having a base electrode, input electrode and output electrode,
   - means for controlling the base electrode current of said first transistor,
   - a second transistor of said one conductivity type connected in series with said first transistor, voltage source and load, said second transistor having a base electrode, input electrode and output electrode,
   - means for biasing the base electrode of said second transistor for conduction below saturation,
   - first and second resistors serially connected between said voltage source and said load,
   - and a third transistor of another conductivity type complementary to said first and second transistors, said third transistor having a base electrode, input electrode and output electrode, and having its input and output electrodes connected in series between the output electrode of said first transistor and the base electrode of said second transistor, and having its base electrode connected to a junction between said first and second resistors.

2. The circuit as defined in claim 1 including impedance means serially connected between the output electrode of said first transistor and the input electrode of said second transistor for biasing said input and output electrodes of said third transistor for operation.

3. The circuit as defined in claim 2 wherein said impedance means comprises a semiconductor diode.

4. The circuit as defined in claim 2 wherein said first and second resistors, associated with said first and second transistors in a parallel relationship between said source and said load, are sufficiently unequal in resistance to render the voltage drop across them substantially equal, thereby compensating for the current through the base electrode of said third transistor which flows through only one of said resistors.

5. The circuit as defined in claim 4 wherein said means for biasing the base electrode of said second transistor comprises a resistor serially connected to a source of potential and the resistance of said resistor is selected to be of a value sufficient to bias said second transistor for class A operation.

6. An improved circuit for controlling current to a two-terminal load comprising
   - a voltage source having two terminals, one terminal being connected to one terminal of said load,
   - a first plurality of series connected transistors, each transistor being of a first conductivity type and having base, emitter and collector electrodes the emitter a plurality of semiconductor diodes, each serially connected between the collector electrode of one of said first plurality of transistors and the emitter electrode of an adjacent one of said first plurality of transistors connected in series for biasing the emitter electrode of an associated one of said second plurality of transistors with respect to its collector electrode operation.

11. An improved circuit for controlling current to a load comprising a voltage source, a load connected in series with said voltage source, a first return path from said load to said voltage source through a first plurality of series-connected transistors of a first conductivity type, each transistor having a base electrode biased for operation as a class A amplifier and having an input and output electrode, a plurality of diodes coupling the output electrode of each of said first plurality of transistors to the input electrode of the next series-connected transistor, means for applying a control signal to the base electrode of one of said first plurality of transistors, a second plurality of transistors of a second conductivity type complementary to said first conductivity type equal in number to one less than the number of said first plurality of transistors, and connected to provide a controlled current path between the output electrode of one of said first plurality of series-connected transistors and the base electrode of the next of said first plurality of transistors in series, and a voltage dividing network connected in parallel with said first return path for said load current, the base electrodes of said second plurality of transistors being connected to intermediate points along said voltage dividing network to control current flow through said second plurality of transistors thereby to vary the base current through said first plurality of transistors and effectively clamp said first plurality of transistors to voltages between their input and output terminals as determined by said voltage dividing network.

12. An improved circuit for controlling a current from a source to a load through a control transistor of a given conductivity type having collector and emitter electrodes connected in series with said source and said load, and having a base electrode for controlling the current to the load comprising a first plurality of series-connected transistors of said first conductivity type connected in series with said source and said control transistor for sharing the difference between the voltages of said source and of said load, each transistor of said given conductivity type having a base, a collector and an emitter electrode, means connected to the base electrodes of said first plurality of transistors for providing bias current for class A operation, a plurality of resistors, one resistor associated with each of said first plurality of transistors and an additional one associated with said control transistor, said resistors being connected in series with said source and said load for dividing the voltage approximately equally between them, a second plurality of transistors of a conductivity type complementary to said given conductivity type, one transistor associated with each of said first plurality of transistors, each of said second plurality of transistors having a base electrode connected to a junction between two of said series-connected resistors, an emitter electrode connected to the base electrode of its associated one of said first plurality of transistors and its collector electrode connected to the collector electrode of the preceding series-connected transistor, the collector electrode of the complementary type transistor associated with the first series-connected transistor having its collector electrode similarly connected to the collector electrode of said control transistor, and means for applying a control signal to the base of said control transistor.

References Cited by the Examiner

UNITED STATES PATENTS

| | | | |
|---|---|---|---|
| 2,888,525 | 5/59 | Eckess et al. | 330—18 |
| 3,018,445 | 1/62 | Stone | 330—18 |
| 3,056,043 | 9/62 | Baude | 307—88.5 |
| 3,109,940 | 11/63 | Baude | 307—88.5 |

ARTHUR GAUSS, *Primary Examiner.*